US006524943B1

(12) United States Patent
Sakuyama

(10) Patent No.: US 6,524,943 B1
(45) Date of Patent: Feb. 25, 2003

(54) METHOD OF FORMING METAL BUMPS

(75) Inventor: Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/961,351

(22) Filed: Sep. 25, 2001

(30) Foreign Application Priority Data

May 7, 2001 (JP) ........................................ 2001-136299

(51) Int. Cl.⁷ ...................... H01L 21/44; H01L 21/4763
(52) U.S. Cl. ...................... 438/613; 438/612; 438/615; 438/618
(58) Field of Search ........................... 438/612–618, 438/619; 257/737, 738, 779–781

(56) References Cited

U.S. PATENT DOCUMENTS 5,672,542 A * 9/1997 Schweibert et al.

FOREIGN PATENT DOCUMENTS

| JP | 04133330 A | * 5/1992 |
| JP | 7-302972 | 11/1995 |

* cited by examiner

*Primary Examiner*—Ha T. Nguyen
(74) *Attorney, Agent, or Firm*—Armstrong, Westerman & Hattori, LLP

(57) ABSTRACT

Metal bumps are formed by using a bump material containing a metal material which melts only partially at a first temperature and melts entirely at a second temperature higher than the first temperature. A resin film is first formed on a surface of a substrate provided with electrodes. Then, openings are formed in the resin film for exposing the electrodes. Then, the bump material is loaded into the openings. Then, the bump material is heated to the first temperature for melting only part of the metal material, followed by cooling the bump material below the first temperature. Then, the resin film is removed. Finally, the bump material is heated to the second temperature for entirely melting the metal material.

7 Claims, 3 Drawing Sheets

METHOD OF FORMING METAL BUMPS

BACKGROUND OF THE INVENTION

1. Field of the Invention

The present invention relates to a bump forming method. More particularly, the present invention relates to a method of forming metal bumps on electrodes provided on a printed circuit board, a wafer or a ceramic board by utilizing a resin film as a mask.

2. Description of the Related Art

Recently, there is an increasing demand for mounting electronic components on a substrate (e.g. a printed circuit board) at high densities. For meeting such a demand, much attention is focused on bear chip mounting. The bear chip mounting includes the face-up bonding which utilizes wire-bonding for providing electrical connection between a chip and a wiring pattern on a circuit board, and the face-down bonding which utilizes metal bumps for providing electrical connection. Recently, the face-down bonding increasingly replaces the face-up bonding.

The face-down bonding which utilizes metal bumps is capable of connecting electronic components at a low resistance. In forming metal bumps, the following requirements should be satisfied.

When the electrodes of an electronic component are arranged at a high density, metal bumps need be correspondingly arranged at a small pitch to be precisely positioned on the electrodes. This is particularly true in forming metal bumps on the electrodes of a semiconductor device. Further, all metal bumps need to have an equal height for ensuring reliable connection between electronic components. In addition, there is also an inherent demand for a decrease in the manufacturing cost.

Conventionally, metal bumps for face-down bonding have been formed by plating or vapor deposition. However, the formation of metal bumps by such methods requires much cost for the equipment while providing difficulties in controlling the height and composition of the bumps. Recently, therefore, the conventional methods are increasingly replaced with a metal mask printing method and a resin mask loading method for realizing a cost reduction while providing a higher freedom in controlling the composition of metal bumps.

FIGS. 2a through 2e illustrate a prior art metal mask printing process for forming metal bumps. According to the metal mask method, as shown in FIG. 2a, use is made of a board 20 provided with electrodes 21, and a metal mask 22 formed with openings 22a corresponding to the electrodes 21. As shown in FIG. 2b, the metal mask 22 is placed on the board 20 for bringing the openings 22a in conformity with the electrodes 21. Then, as shown in FIG. 2c, a solder paste 23 25 containing solder powder is loaded in each of the openings 22 by printing. Then, as shown in FIG. 2d, the metal mask 22 is removed from the board 20. Subsequently, as shown in FIG. 2e, the solder powder contained in the solder paste 23 is melted by heating, thereby providing generally spherical metal bumps 24 on the electrodes 21 of the board 20. The metal bump formation by such a metal mask printing method is disclosed in JP-A-7-302972 for example.

FIGS. 3a through 3e illustrate a prior art resin mask loading process for forming metal bumps. First, as shown in FIG. 3a, a resin film 32 is formed on a board 30 provided with electrodes 31. Then, as shown in FIG. 3b, the resin film 32 is partially etched away for forming openings 32a for exposing the electrodes 31 of the board 30. Then, as shown in FIG. 3c, a solder paste 33 containing solder powder is loaded in each of the openings 32a. Subsequently, as shown in FIG. 3d, solder powder contained in the solder paste 23 is melted by heating, thereby providing generally spherical metal bumps 34 on the electrodes 31 of the board 30. Finally, as shown in FIG. 3e, the resin mask 32 is removed from the board 30.

The metal mask printing method described above has a drawback that it has difficulties in controlling the height of the metal bumps formed at a relatively small pitch. Specifically, when the openings 22a of the metal mask 22 are arranged at a small pitch, removal of the metal mask 22 may cause part of the solder paste 23 filled in the openings 22a to be removed together. As a result, the metal bumps 24 may vary significantly in height, which may hinder reliable mounting of electronic components.

In the resin mask loading method, on the other hand, the resin film 32 as a printing mask is removed after the solder paste 33 are melted by heating. Therefore, it is possible to reliably form each of the metal bumps 35 with a predetermined amount of solder paste even when electrodes are arranged at a small pitch. Thus, in comparison with the metal mask printing method, the resin mask loading method is preferable for forming metal bumps at a small pitch which is necessary for realizing high density mounting of electronic components.

However, the prior art resin mask loading method has the following problems. In melting the solder powder contained in the solder paste 33 in the step shown in FIG. 3d, the solder powder is generally heated at a temperature which is 30~50° C. higher than the melting point of the solder metal. In this heating step, however, the resin film (typically made of a thermosetting resin) hardens to some extent under heating. Therefore, in removing the resin film in the subsequent step shown in FIG. 3e, part of the resin film thus hardened may remain on the surface of the board, which hinders reliable mounting of electronic components.

SUMMARY OF THE INVENTION

It is therefore an object of the present invention to provide a method of forming metal bumps using a resin film, which is capable of easily removing the resin film for forming good bumps which allow reliable mounting of electronic components.

According to a first aspect of the present invention, a method of forming metal bumps is provided which comprises the steps of: forming a resin film on a surface of a substrate provided with electrodes; forming openings in the resin film for exposing the electrodes; loading a bump material into the openings, the bump material containing a metal material which melts only partially at a first temperature, the metal material melting entirely at a second temperature higher than the first temperature; heating the bump material to the first temperature for melting only part of the metal material; cooling the bump material below the first temperature; removing the resin film; and heating the bump material to the second temperature for entirely melting the metal material.

With the above-described method, it is possible to remove the resin film from the surface of the substrate more reliably than in the prior art method. Specifically, when the bump material loaded in the openings is heated to the first temperature (hereinafter referred to as "primary heating"), only part of the metal material changes from solid phase to liquid phase. At this time, due to surface tension, the liquid phase part tends to cohere for integration with the remaining solid phase part. When the bump material is thereafter cooled below the first temperature, the liquid phase part returns to solid phase for fixing to the electrodes (hereinafter referred to as "provisionally fixing"). The cooling herein includes natural cooling wherein no positive cooling using a coolant is performed. According to the present invention, the resin film formed on the surface of the board as a mask is removed after the provisional fixing.

In the prior art method, since the bump material is heated immediately to such a high temperature as to completely melt the metal material contained therein, the resin film hardens undesirably due to such heating, consequently leading to difficulty in removing the resin film. According to the present invention, by contrast, the bump material is provisionally fixed to the electrodes by the primary heating followed by subsequent cooling, and the resin film is removed before the solder material is heated at the second temperature (hereinafter referred as "secondary heating") which is higher than the first temperature. Therefore, the resin film can be removed more easily than in the prior art method. With no resin film left on the substrate, electronic components can be reliably mounted on the substrate via the bumps.

In a first embodiment, the metal material comprises a metal alloy of a composition which has a solid-liquid coexistent temperature range between a solidus temperature and a liquidus temperature. In the first embodiment, the first temperature is equal to or higher than the solidus temperature and lower than the liquidus temperature, whereas the second temperature being equal to or higher than the liquidus temperature.

Herein, the solidus temperature and the liquidus temperature are defined as follows. Under a given pressure, the solidus temperature of an alloy is a temperature below which the alloy exists only in solid phase, whereas the liquidus temperature of an alloy is a temperature above which the alloy exists only in liquid phase. At temperatures including and between the solidus temperature and the liquidus temperature, the solid phase and liquid phase of the alloy coexist.

In a second embodiment, the metal material contains a plurality of different metals. In the second embodiment, one of the metals has a lowest melting point, whereas another of the metals has a highest melting point. Further, the first temperature is equal to or higher than the lowest melting point and lower than the highest melting point, whereas the second temperature is equal to or higher than the highest melting point.

Herein, the melting point of a metal is the "melting point" in its normal sense for a mono-elemental metal. For an alloy, on the other hand, the melting point means the liquidus temperature of that alloy under a given pressure.

According to the second embodiment, it is possible to individually select said one metal for melting under the primary heating and said another metal for melting under the econdary heating, so that the composition of the resulting umps can be easily controlled.

According to a second aspect of the present invention, method of forming metal bumps is provided which comprises the steps of: forming a resin film on a surface of a board provided with electrode; forming openings in the resin film for exposing the electrodes; loading a bump material into the openings, the bump material containing a metal of a composition which has a solid-liquid coexistent temperature range between a solidus temperature and a liquidus temperature; heating the bump material to a first temperature which is equal to or higher than the solidus temperature and lower than the liquidus temperature; cooling the bump material below the solidus temperature; removing the resin film; and heating the bump material to a second temperature which is equal to or higher than the liquidus temperature.

According to a third aspect of the present invention, a method of forming metal bumps comprising the steps of: forming a resin film on a surface of a substrate provided with electrodes; forming openings in the resin film for exposing the electrode portions; loading a bump material into the openings, the bump material containing a plurality of different metals, one of the metals having a lowest melting point, another of the metals having a highest melting point; heating the bump material to a first temperature which is equal to or higher than the lowest melting point and lower than the highest melting point; cooling the bump material below the lowest melting point; removing the resin film; and heating the bump material to a second temperature which is equal to or higher than the highest melting point.

The substrate used in the present invention may be a silicon wafer or a circuit board formed of glass-fiber-reinforced epoxy resin. The substrate is provided, at predetermined portions thereof, with a plurality of electrodes made of copper, nickel, or gold for example.

The resin film may be made of a photosensitive resin such as an acryl-based, epoxy-based or imide-based resin or a combination of these resins. The resin film may be etched by utilizing the known photolithography including light-exposure and development.

Alternatively, use may be made of a non-photosensitive resin. In such a case, etching may be performed by the application of a laser beam.

The resin film may be separately prepared and attached to the substrate. Instead, the resin film may be formed in situ by applying a liquid resin on the substrate. For forming high bumps on the electrodes at a small pitch, it is preferable that the resin film has a thickness of 30~150 $\mu$m.

The resin film may be removed with a stripping agent. Examples of the stripping agent include strong alkali such as an aqueous solution of sodium hydroxide, organic alkali such as an aqueous solution of monoethanolamine or an aqueous solution of tetramethylammonium hydroxide. In use, the stripping agent may be mixed with an additive which preferably has a function of breaking the resin film into small pieces to prevent the resin from remaining on the board.

Preferably, the bump material may be in the form of a paste prepared by kneading metal powder with a flux. The flux may be a mixture of rosin, a thixotropic agent, an activator, and a solvent for example.

The bump material may contain an alloy consisting of at least two metal elements selected from the group consisting of Sn, Pb, Ag, Sb, Bi, Cu, In, and Zn for example. Specific examples include Sb—Sn alloy, Sn—Bi alloy, Sn—In alloy, Sn—Pb alloy, Sn—Ag alloy, Sn—Cu alloy, Sn—Zn alloy and Sn—Pb—Sb alloy. More specifically, 5% Sn–95% Pb alloy, 43% Sn–57% Bi alloy or 48% Sn–52% In alloy may be used. Alternatively, the bump material may contain a mono-elemental metal such as Sn, Pb or In.

Rosin has a primary role of increasing tackiness of the solder paste. Specifically, use may be made of polymerized rosin, hydrogenated rosin or esterified rosin.

The thixotropic agent has a primary role of providing the solder paste with shape-holding ability. Examples of the thixotropic agent include hardened caster oil and stearic amide.

The activator has a role of removing an oxide film or the like formed on the surfaces of the solder particles and/or on the surfaces of the electrodes when the solder paste is heated. With the aid of the activator, the surfaces of the solder particles and/or the surfaces of the electrodes can be cleaned, which enhances adhesion of the solder to the electrodes and thereby enables reliable formation of good metal bumps. Organic acid and/or organic amine may be used as the activator. Examples include sebacic acid, succinic acid, adipic acid, glutaric acid, triethanolamine, and monoethanolamine.

The solvent has a role of melting soluble components and making the flux vehicle into a pasty state. Preferably, a solvent having a boiling point which is close to or higher than the melting point of the solder may be used alone or in combination with another such solvent. Examples include higher alcohols and glycol ethers such as diethylene glycol dimethyl ether, n-buthyl phenyl ether, 2-methyl-2, 4-pentanediol, and diethylene glycol monobutyl ether.

Preferably, each of the openings formed in the resin film for loading the solder paste has an area no more than 25 times the area of a corresponding electrode. This makes the solder collect reliably on each of the electrodes upon melting for reliably forming a spherical bump.

Other features and advantages of the present invention will become clearer from the detailed description given below with reference to the accompanying drawings.

DETAILED DESCRIPTION OF THE PREFERRED EMBODIMENTS

Preferred embodiments of the present invention will be described below in detail with reference to FIGS. 1a~1g.

Figure 1A:
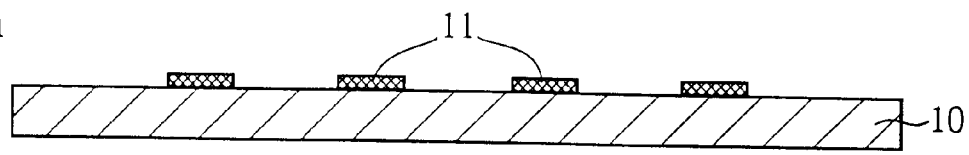
FIGS. 1a through 1g illustrate a series of process steps for forming metal bumps in accordance with the present invention.
Figure 1B:
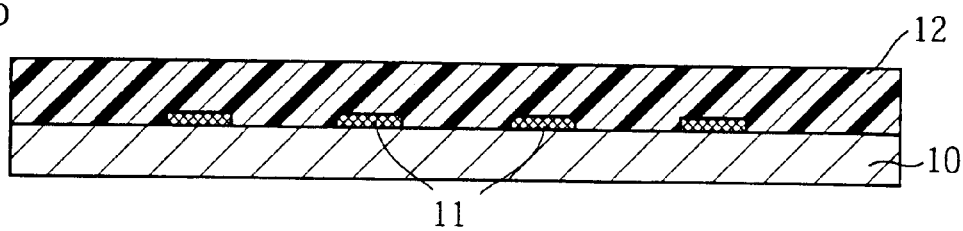

First, as shown in FIG. 1a, a substrate 10 (e.g. a circuit board) on which bumps are to be formed is prepared. The substrate 10 has a surface which is previously formed with a plurality of electrodes 11 at a predetermined pitch. The surface of the substrate 10 is further formed with a wiring pattern (not shown) electrically connected to the electrodes Then, as shown in FIG. 1b, a resin film 12 formed of a photosensitive resin is disposed and bonded under pressure onto the board 10 for covering the electrodes 11. The resin film 12 may be formed by applying a liquid resin to the surface of the board 10 by spin-coat followed by thermally hardening the resin.

Figure 1C:
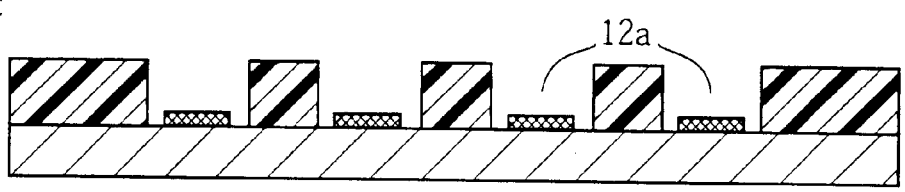

Subsequently, as shown in FIG. 1c, a plurality of openings 12a are formed in the resin film 12 at locations corresponding to the electrodes 11 for exposing the electrodes 11. The openings 12a may be formed by light-exposure using predetermined photo-mask (not shown), followed by eveloping.

Figure 1D:
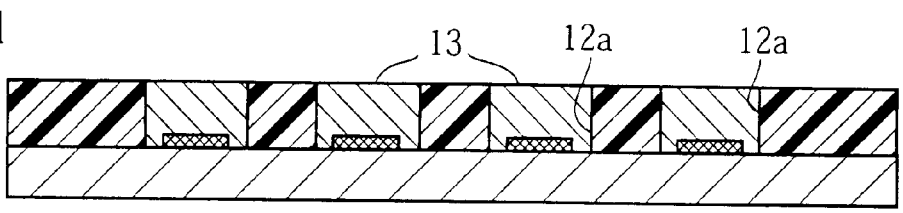

Then, as shown in FIG. 1d a solder paste 13 is loaded in each of the openings 12a. At this time, it is desirable that a large amount of excess solder paste does not remain on the upper surface of the resin film 12. For this purpose, the excess of solder paste adhering on the upper surface of the resin film 12 is scraped off using a squeegee for example.

The solder paste 13 in this embodiment contains a single kind of alloy. The alloy is in the form of powder and so composed as to include solid-liquid coexisting temperature range between the liquidus temperature and the solidus temperature. The solder paste may contain plural kinds of alloy.

Figure 1E:
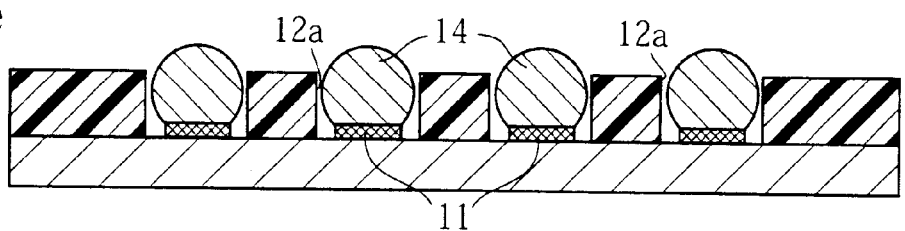

Subsequently, in a primary heating step shown in FIG. 1e, the solder paste 13 is heated to a first temperature (primary heating) between the liquidus temperature and solidus temperature of the alloy contained in the solder paste, and the first temperature is kept for a predetermined period of time. Due to heating at the first temperature, part of the alloy changes from solid phase to liquid phase while the remaining part of the alloy remains in solid phase so that the alloy is kept in equilibrium of liquid phase and solid phase. Further, at the first temperature, most part of the ingredients of the solder paste other than the alloy (including rosin for example), vaporizes for dissipation from the solder paste 13. As a result, as shown in FIG. 1e, due to the surface tension of the molten part of the alloy and of the rosin remaining in a small amount, the solder powder in the solder paste material integrates or collects to have a spherical shape in each of the opening 12a. Thereafter, the solder paste is cooled below the solidus temperature so that the molten part of the alloy returns to solid phase. As a result, the entire solder paste material is provisionally fixed to each of the electrodes to provide an incomplete bump 14.

Figure 1F:
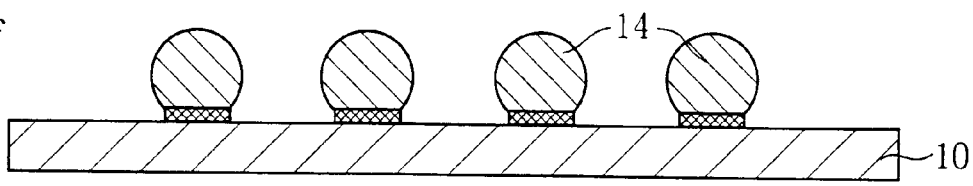

As shown in FIG. 1f, after the incomplete bumps 14 are formed in the above-described manner, the resin film 12 is removed from the surface of the board 10. At this time, a suitable solvent may be selected for removing the resin film 12. Since the resin film 12 has not yet undergone higher-temperature secondary heating for completely melting the alloy and therefore is not hardened to a higher extent, the resin film 12 can be removed easily under gentle conditions.

Figure 1G:
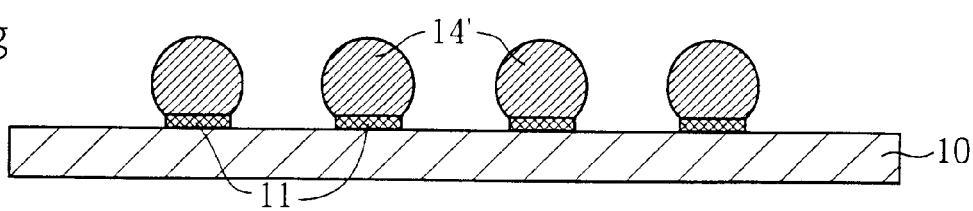
Figure 2A:
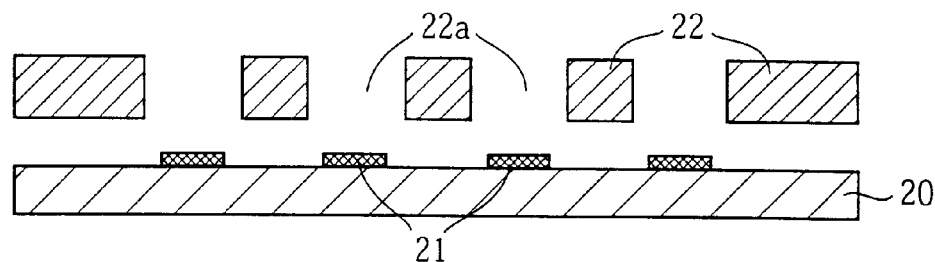
FIGS. 2a through 2e illustrate a series of process steps for forming metal bumps according to a prior art metal mask printing method.
Figure 2B:
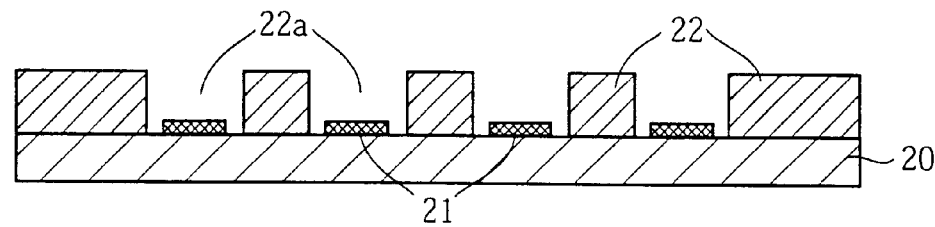
Figure 2C:
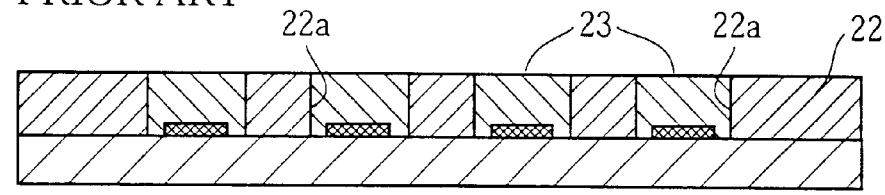
Figure 2D:
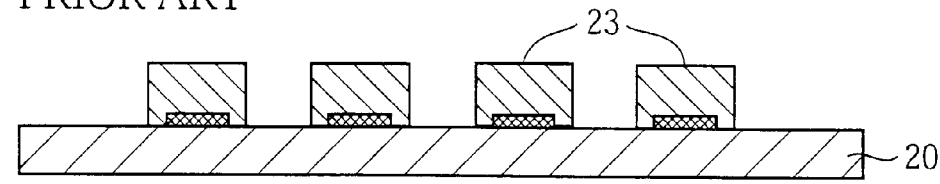
Figure 2E:
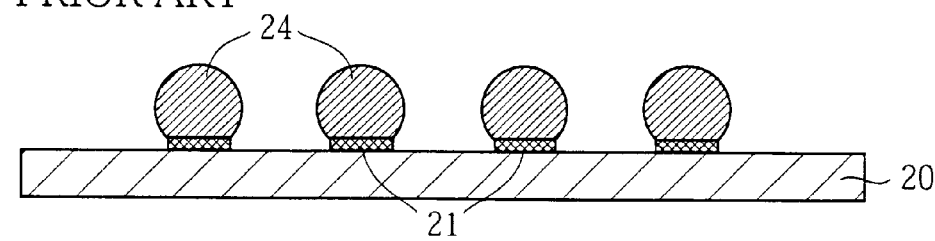
Figure 3A:
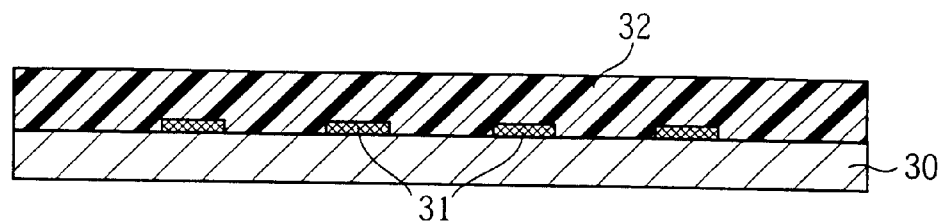
FIGS. 3a through 3e illustrate a series of process steps for forming metal bumps according to a prior art resin film loading method.
Figure 3B:
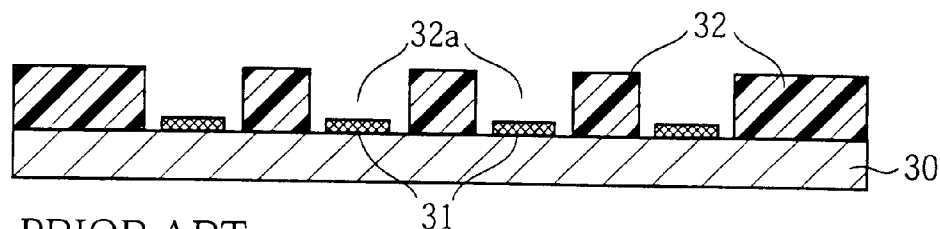
Figure 3C:
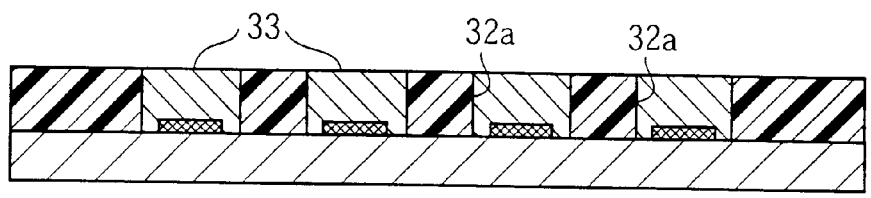
Figure 3D:
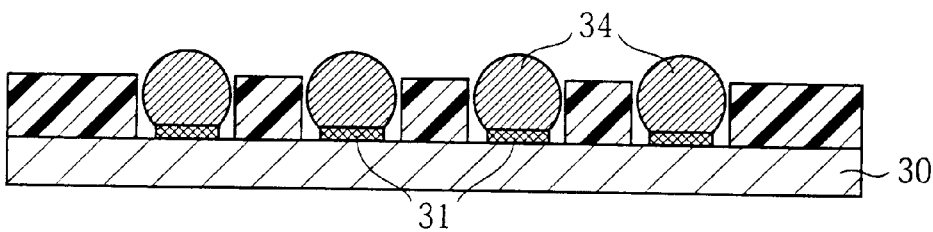
Figure 3E:
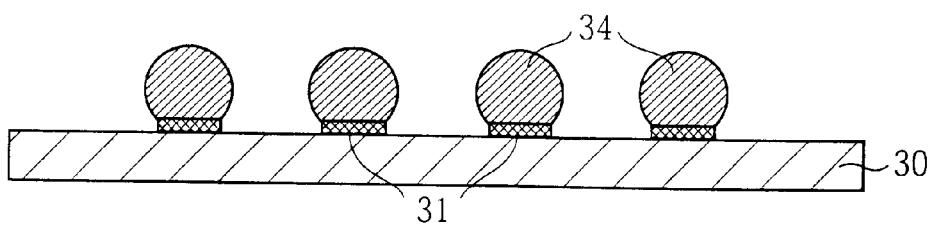

Then, in the secondary heating step shown in FIG. 1g, the solder paste is heated to a second temperature which is equal to or higher than the liquidus temperature of the alloy, and the second temperature is kept for a predetermined period of time. As a result, the entire alloy melts. Thus, upon subsequent cooling, the melted alloy solidifies into a complete bump 14' on each of the electrodes 11 on the board 10.

Even when the solder paste 13 contains a plurality of different metals which differs from each other in melting point, it is possible to reliably form metal bumps 14' by easily removing the resin film 12 by the above-described process steps shown in FIGS. 1a~1g. The "metals" referred to herein include mono-elemental metals and alloys. For a mono-elemental metal, the term "melting point" means the melting point in the normal sense, whereas, for an alloy, the term "melting point" means the liquidus temperature under a given pressure.

Specifically, in the primary heating step shown in FIG. 1e, the solder paste 13 is heated to a first temperature equal to or higher than the melting point of a lowest-melting-point metal and lower than the melting point of a highest-melting-point metal, and the first temperature is kept for a predetermined period of time. In the secondary heating step shown in FIG. 1g, the solder paste is heated to a second temperature equal to or higher than the melting point of the highest-melting-point metal, and the second temperature is kept for a predetermined period of time. As a result, an incomplete bump 14 is formed by removing the resin film 12 after the primary heating (but before the secondary heating) and a complete bump 14' is formed on each of the electrodes 11 on the board 10 after the secondary heating.

When a plurality of alloys are contained in the solder material, it is possible to reliably form metal bumps 14' by the process steps shown in FIGS. 1a~1g. In this case, the primary heating is performed at a first temperature equal to or higher than a lowest solidus temperature and lower than a highest liquidus temperature, whereas the secondary heating is performed at a second temperature equal to or higher than the highest liquidus temperature.

Next, description is made as to specific examples of the resent invention.

EXAMPLE 1

(Preparation of Solder Paste)

Solder of 50% Sn–50% Pb alloy (solidus temperature:183° C., liquidus temperature :238° C.) was powdered to have an average particle size of 20 $\mu$m, and the solder powder was mixed with a flux at a volume ratio of 1:1 to prepare a solder paste. The flux used was a mixture of 50 wt % POLY-PALE resin as rosin, 20 wt % diethylene glycol monobutyl ether and 20 wt % 2-methyl-2, 4-pentanediol as solvents, 8 wt % sebacic acid as an activator, and 2 wt % hydrogenated castor oil as a thixotropic agent.

(Formation of Bumps)

A film made of acrylic photosensitive resin (NIT-250 available Nichigo-Morton Co., Ltd.) having a thickness of 50 $\mu$m was bonded by thermo-compression (at 100° C. under a pressure of 3.5 kg/mm$^2$) onto a wafer provided with 300,000 electrodes (Diameter: 70 $\mu$m; Pitch: 150 $\mu$m). Then, the resin film was exposed to light at portions corresponding to the electrodes by the use of a glass mask. Then, the resin film was etched using 1.0% aqueous solution of sodium carbonate for development to form a plurality of openings having a diameter of 130 $\mu$m at locations corresponding to the electrodes. Then, the above-described solder paste was loaded into the openings of the resin film by using a urethane squeegee. Subsequently, primary heating was performed for one minute at 220° C. which was higher than the solidus temperature of the 50% Sn–50% Pb solder to roughly or provisionally integrate the solder. Thereafter, the solder was cooled and provisionally fixed to the electrodes as incomplete bumps. Then, by immersing into 10% aqueous solution of monoethanolamine, the resin film was removed. Thereafter, a flux (R5003 available from Alpha Metals Japan Ltd.) was applied to the incomplete bumps provisionally fixed to the electrodes, and secondary heating was performed for two minutes at 275° C. which was higher than the liquidus temperature of the 50% Sn~50% Pb solder to completely melt and integrate the solder. The solder was then cooled to provide complete bumps on the electrodes.

(Results)

In Example 1, the removal of the resin film after the primary heating was satisfactory. The complete bumps had a height of 80 $\mu$m±3 $\mu$m. In this way, highly uniform bumps having little height variation were formed. The alloy composition, solidus temperature, liquidus temperature, primary heating temperature, secondary heating temperature in the above-described Example 1 are given in Table 1 together with those for Examples 2–5 to be described below.

EXAMPLE 2

Solder of 20% Sn–80% Pb alloy (solidus temperature: 183° C., liquidus temperature: 277° C.) was used to prepare a solder paste in a manner similar to Example 1. In Example 2, the primary heating was performed at 240° C., whereas the secondary heating was performed at 320° C. As a result, the removal of the resin film after the primary heating was satisfactory. Further, the complete bumps had a height of 80 $\mu$m. In this way, highly uniform bumps of little height variation were formed.

EXAMPLE 3

Solder of 10% Sn–90% Pb alloy (solidus temperature: 275° C., liquidus temperature: 300° C.) was used to prepare a solder paste in a manner similar to Example 1. In Example 3, the primary heating was performed at 285° C., whereas the secondary heating was performed at 340° C. As a result, the removal of the resin film after the primary heating was satisfactorily performed. Further, the complete bumps had a height of 80 $\mu$m±3 $\mu$m. In this way, highly uniform bumps of little height variation were formed.

EXAMPLE 4

Solder of 92% Sn–8% Sb alloy (solidus temperature: 238° C., liquidus temperature: 251° C.) was used to prepare a solder paste in a manner similar to Example 1. In Example 4, the primary heating was performed at 240° C., whereas the secondary heating was performed at 280° C. As a result, the removal of the resin film after the primary heating was satisfactory. Further, the complete bumps had a height of 80 $\mu$m±3 $\mu$m. In this way, highly uniform bumps of little height variation were formed.

EXAMPLE 5

Solder of 10% Sn–85% Pb–5% Sb alloy (solidus temperature: 239° C., liquidus temperature: 277° C.) was used to prepare a solder paste in a manner similar to Example 1. In Example 5, the primary heating was performed at 260° C., whereas the secondary heating was performed at 300° C. As a result, the removal of the resin film after the primary heating was satisfactory. The complete bumps had a height of 80 $\mu$m±3 $\mu$m. In this way, highly uniform bumps of little height variation were formed.

TABLE 1

|  | Composition | Solidus Temp./° C. | Liquidus Temp./° C. | Primary Heating/° C. | Secondary Heating/° C. |
|---|---|---|---|---|---|
| Ex. 1 | 50% Sn-50% Pb | 183 | 238 | 220 | 275 |
| Ex. 2 | 20% Sn-80% Pb | 183 | 277 | 240 | 320 |
| Ex. 3 | 10% Sn-90% Pb | 275 | 300 | 285 | 340 |
| Ex. 4 | 92% Sn-8% Sb | 238 | 251 | 240 | 280 |
| Ex. 5 | 10% Sn-85% Pb-5% Sb | 239 | 277 | 260 | 300 |

EXAMPLE 6

(Preparation of Solder Paste)

Solder of 63% Sn–37% Pb alloy as Metal I having a lower liquidus temperature (liquidus temperature: 183° C.) and solder of 2% Sn–98% Pb alloy as Metal II having a higher liquidus temperature (liquidus temperature: 320° C.) were powdered to have an average particle size of 20 $\mu$m, and mixed in a weight ratio of 1:9. The mixed solder was mixed with a flux to prepare a solder paste. The flux used was a mixture of 50wt % Polypale as rosin resin, 20wt % diethylene glycol monobutyl ether and 20wt % 2-methyl-2,4- pentanediol as solvents, 8wt % sebacic acid as an activator, and 2wt % hardened castor oil as a thixotropic agent.
(Formation of Bump)

A film made of acrylic photosensitive resin (NIT-250 available from Nichigo Morton) having a thickness of 50 μm was bonded by thermo-compression (at 100 ° C. under a pressure of 3.5 kg/mm²) onto a wafer provided with 300,000 electrodes (Diameter: 70 μm; Pitch: 150 μm). Then, the resin film was exposed to light at portions corresponding to the electrodes by the use of a glass mask and etched using 1.0% aqueous solution of sodium carbonate for development to form a plurality of openings having a diameter of 130 μm at locations corresponding to the electrodes. Then, the above-described solder paste was loaded into the openings of the resin film by using a urethane squeegee. Subsequently, primary heating was performed for one minute at 213° C. which was higher than the liquidus temperature of the 63% Sn–37% Pb solder to roughly or provisionally integrate the solder. Then, the solder was cooled and provisionally fixed to the electrodes as incomplete bumps. Then, the resin film was removed by immersing into 10% aqueous solution of monoethanolamine. Then, a flux (R5003 available from Alpha Metals) was applied to the incomplete bumps provisionally fixed to the electrodes, and secondary heating was performed for two minutes at 350° C. which was higher than the liquidus temperature of the 2% Sn–98% Pb solder to completely melt and integrate the solder. The solder was then cooled to provide complete bumps on the electrodes.
(Results)

In Example 6, the removal of the resin film after the primary heating was satisfactory, and the complete bumps had a height of 80 μm±3 μm. In this way, highly uniform bumps of little height variation were formed. The composition of the complete bumps was controlled to a deviation of up to± 0.2% from the target 8% Sn–92% Pb composition. The metal composition, mixture proportion, primary heating temperature, secondary heating temperature, and resulting composition in Example 6 are given in Table 2 together with those for Examples 7–9 to be described below.

EXAMPLE 7

Solder of 35% Sn–65% Pb alloy as Metal I (liquidus temperature: 246° C.) and solder of 2% Sn–98% Pb alloy as Metal II (liquidus temperature: 320° C.) mixed in a weight ratio of 1:9 were used to prepare a solder paste in a manner similar to Example 6. In Example 7, the primary heating was performed at 265° C. As a result, the removal of the resin film after the primary heating was satisfactory, and the complete bumps had a height of 80 μm±3 μm. In this way, highly uniform bumps of little height variation were formed. Further, the composition of the complete bumps was controlled to a deviation of up to ±0.2% from the target 5% Sn–95% Pb composition.

EXAMPLE 8

100% Sn as Metal I (melting point: 232° C.) and 100% Pb as Metal II (melting point: 327° C.) mixed in a weight ratio of 1:9 were used to prepare a solder paste in a manner similar to Example 6. In Example 8, the primary heating was performed at 262° C., whereas the secondary heating was performed at 357° C. As a result, the removal of the resin film after the primary heating was satisfactory, and the complete bumps had a height of 80 μm±3 μm. In this way, highly uniform bumps of little height variation were formed. Further, the composition of the complete bumps was controlled to a deviation of up to ±0.2% from the target 10% Sn–90% Pb composition.

EXAMPLE 9

100% Sn as Metal I (melting point: 232° C.) and 100% Pb as Metal II (melting point: 327° C.) mixed in a weight ratio of 1:19 were used to prepare a solder paste in a manner similar to Example 6. The primary heating was performed at 262° C., whereas the secondary heating was performed at 357° C. As a result, the removal of the resin film after the primary heating was satisfactory, and the complete bumps had a height of 80 μm±3 μm. In this way, highly uniform bumps of little height variation were formed. Further, the composition of the complete bumps was controlled to a deviation of up to ±0.2% relative to the target 5% Sn–95% Pb composition.

TABLE 2

|  | Metal I Composition | Metal II Composition | Mix Ratio I:II | Primary Heating/° C. | Secondary Heating/° C. | Final Composition |
| --- | --- | --- | --- | --- | --- | --- |
| Ex. 6 | 63% Sn-37% Pb (Liq. Tem. 183° C.) | 2% Sn-98% Pb (Liq. Temp. 320° C.) | 1:9 | 213 | 350 | 8% Sn-92% Pb |
| Ex. 7 | 2% Sn-98% Pb (Liq. Tem. 246° C.) | 35% Sn-65% Pb (Liq. Temp. 320° C.) | 1:9 | 265 | 350 | 5% Sn-95% Pb |
| Ex. 8 | 100% Sn (M.P. 232) | 100% Pb (M.P. 327) | 1:9 | 262 | 357 | 10% Sn-90% Pb |
| Ex. 9 | 100% Sn (M.P. 232) | 100% Pb (M.P. 327) | 1:19 | 262 | 357 | 5% Sn-95% Pb |

Thus, with the bump forming method according to the present invention, it is possible to prevent the resin film from hardening, which facilitates removal of the resin film from the board for reliably mounting electronic components on the board via the bumps.

The present invention being thus described, it is obvious that the same may be varied in many ways. Such variations should not be regarded as a departure from the spirit and scope of the present invention, and all such variations as would be obvious to those skilled in the art are intended to be included in the scope of the following claims.

What is claimed is:

1. A method of forming metal bumps comprising the steps of:

forming a resin film on a surface of a substrate provided with electrodes;

forming openings in the resin film for exposing the electrodes;

loading a bump material into the openings, the bump material containing a metal material which melts only partially at a first temperature, the metal material melting entirely at a second temperature higher than the first temperature;

heating the bump material to the first temperature for melting only part of the metal material;

cooling the bump material below the first temperature;

removing the resin film; and heating the bump material to the second temperature for entirely melting the metal material;

wherein the step of removing the resin film is performed after the step of heating the bump material to the first temperature and the subsequent step of cooling the bump material but before the step of heating the bump material to the second temperature so that the resin film is removed before it is hardened.

2. The method according to claim 1, wherein the metal material comprises a metal alloy of a composition which has a solid-liquid coexistent temperature range between a solidus temperature and a liquidus temperature, the first temperature being equal to or higher than the solidus temperature and lower than the liquidus temperature, the second temperature being equal to or higher than the liquidus temperature.

3. The method according to claim 1, wherein the metal material contains a plurality of different metals, one of the metals having a lowest melting point, another of the metals having a highest melting point, the first temperature being equal to or higher than the lowest melting point and lower than the highest melting point, the second temperature being equal to or higher than the highest melting point.

4. The method according to claim 1, wherein the resin film is made of a photosensitive resin.

5. The method according to claim 1, wherein the metal material is contained in the bump material as powder, the bump material comprising a solder paste containing the metal powder mixed with a resin and a solvent.

6. A method of forming metal bumps comprising the steps of:

forming a resin film on a surface of a substrate provided with electrodes;

forming openings in the resin film for exposing the electrodes;

loading a bump material into the openings, the bump material containing a metal of a composition which has a solid-liquid coexistent temperature range between a solidus temperature and a liquidus temperature;

heating the bump material to a first temperature which is equal to or higher than the solidus temperature and lower than the liquidus temperature;

cooling the bump material below the solidus temperature;

removing the resin film; and heating the bump material to a second temperature which is equal to or higher than the liquidus temperature;

wherein the step of removing the resin film is performed after the step of heating the bump material to the first temperature and the subsequent step of cooling the bump material but before the step of heating the bump material to the second temperature so that the resin film is removed before it is hardened.

7. A method of forming metal bumps comprising the steps of:

forming a resin film on a surface of a substrate provided with electrodes;

forming openings in the resin film for exposing the electrode portions;

loading a bump material into the openings, the bump material containing a plurality of different metals, one of the metals having a lowest melting point, another of the metals having a highest melting point;

heating the bump material to a first temperature which is equal to or higher than the lowest melting point and lower than the highest melting point;

cooling the bump material below the lowest melting point;

removing the resin film; and heating the bump material to a second temperature which is equal to or higher than the highest melting point;

wherein the step of removing the resin film is performed after the step of heating the bump material to the first temperature and the subsequent step of cooling the bump material but before the step of heating the bump material to the second temperature so that the resin film is removed before it is hardened.

* * * * *